US011816351B2

(12) United States Patent
Zhang

(10) Patent No.: US 11,816,351 B2
(45) Date of Patent: Nov. 14, 2023

(54) WRITE OPERATION CIRCUIT, SEMICONDUCTOR MEMORY, AND WRITE OPERATION METHOD

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 372 days.

(21) Appl. No.: 17/241,012

(22) Filed: Apr. 26, 2021

(65) Prior Publication Data

US 2021/0247926 A1 Aug. 12, 2021

Related U.S. Application Data

(63) Continuation of application No. PCT/CN2020/097505, filed on Jun. 22, 2020.

(30) Foreign Application Priority Data

Oct. 25, 2019 (CN) .......................... 201911021590.5

(51) Int. Cl.
G06F 3/06 (2006.01)

(52) U.S. Cl.
CPC .......... G06F 3/0655 (2013.01); G06F 3/0604 (2013.01); G06F 3/0679 (2013.01)

(58) Field of Classification Search
CPC .... G06F 3/0655; G06F 3/0604; G06F 3/0679; G11C 11/409; G11C 11/4093; G11C 11/4096; G11C 7/1006; G11C 7/1051
(Continued)

(56) References Cited

U.S. PATENT DOCUMENTS 7,869,525 B2 * 1/2011 Macri ................... H03L 7/0816
710/305
10,861,508 B1 * 12/2020 Mathur ................ G11C 7/1084
(Continued)

FOREIGN PATENT DOCUMENTS

CN 102611951 A 7/2012
CN 105280222 A 1/2016
(Continued)

OTHER PUBLICATIONS

European Patent Office, Extended European Search Report Issued in Application No. 20878228.4, dated Apr. 7, 2022, Germany, 12 pages.

*Primary Examiner* — Fernando Hidalgo
(74) *Attorney, Agent, or Firm* — KILPATRICK TOWNSEND & STOCKTON LLP

(57) ABSTRACT

Embodiments provide a write operation circuit, a semiconductor memory, and a write operation method. The write operation circuit includes: a data determination module that determines whether to flip the current input data according to the previous depending on the number of changed data bits between the previous input data and the current input data of the semiconductor memory so as to generate a flip flag data and an intermediate data; a data buffer module that is used to determine an initial state of a global bus according to an enable signal and the intermediate data; and a data receiving module that receives the global bus data on the global bus, and receives the flip flag data through the flip flag signal line, and that is used to decode the global bus data according to the flip flag data, and write the decoded data into a memory block of the semiconductor.

14 Claims, 4 Drawing Sheets

(58) Field of Classification Search
USPC .................................................. 365/189.011
See application file for complete search history.

(56) References Cited

U.S. PATENT DOCUMENTS

| | | | |
|---|---|---|---|
| 2003/0158981 A1* | 8/2003 | LaBerge | G06F 13/4243 |
| | | | 710/100 |
| 2005/0216630 A1* | 9/2005 | Gaskins | G06F 13/4072 |
| | | | 326/86 |
| 2009/0044032 A1 | 2/2009 | Chainer | |
| 2009/0244991 A1* | 10/2009 | Iwasa | H04L 25/4915 |
| | | | 365/189.08 |
| 2013/0159594 A1* | 6/2013 | Bjegovic | G06F 13/4022 |
| | | | 710/316 |
| 2013/0286523 A1* | 10/2013 | Mullins | H01R 13/641 |
| | | | 439/620.21 |
| 2016/0267029 A1* | 9/2016 | Nagase | G06F 13/4068 |
| 2020/0117536 A1* | 4/2020 | Lu | G06F 11/1048 |
| 2023/0098852 A1* | 3/2023 | Katoch | G11C 11/4096 |
| | | | 365/207 |

FOREIGN PATENT DOCUMENTS

| | | |
|---|---|---|
| CN | 109979505 A | 7/2019 |
| EP | 2048668 A1 | 4/2009 |

* cited by examiner

WRITE OPERATION CIRCUIT, SEMICONDUCTOR MEMORY, AND WRITE OPERATION METHOD

CROSS REFERENCE

This application is a continuation of PCT/CN2020/097505, filed on Jun. 22, 2020, which claims the priority to and benefit of Chinese patent application number 201911021590.5, entitled "Write Operation Circuit, Semiconductor Memory, and Write Operation Method", and filed on Oct. 25, 2019 with China National Intellectual Property Administration, the entire contents of which are incorporated herein by reference in its entirety.

TECHNICAL FIELD

This application relates to the technical field of semiconductor memories, and in particular to a write operation circuit, a semiconductor memory, and a write operation method.

BACKGROUND

Semiconductor memories include static random access memory (SRAM), dynamic random access memory (DRAM), and synchronous dynamic random access memory (SDRAM), Read-Only Memory (ROM), flash memory, etc.

In the DRAM protocol of the Joint Electron Device Engineering Council (JEDEC), there are specific speed and power saving requirements for DRAM. It therefore has become an urgent problem to be solved as to make DRAM more power-saving while also ensuring signal integrity and reliability of data transfer and storage.

SUMMARY

Embodiments of the present application provide a write operation circuit, a semiconductor memory, and a write operation method to solve or alleviate one or more technical problems in the prior art.

In a first aspect, an embodiment of the present application provides a write operation circuit applied to a semiconductor memory, the write operation circuit comprising:

a data determination module, configured to determine whether to flip a current input data depending on a number of changed data bits between a previous input data and the current input data of the semiconductor memory to generate a flip flag data and intermediate data;

a data buffer module, coupled to the data determination module and configured to determine an initial state of a global bus based on an enable signal and the intermediate data; and a data receiving module coupled to a memory bank, where the data receiving module is configured to receive a global bus data on the global bus, receive the flip flag data through a flip flag signal line, decode the global bus data according to the flip flag data, and write the decoded data into the memory bank of the semiconductor, where the decoding includes determining whether to flip the global bus data.

In one embodiment, the data determination module is configured to: determine a change flag data according to the change between the current input data and the previous input data; when the number of high bits in the change flag data is greater than a preset value, output a flipped data of the current input data as the intermediate data, and set the flip flag data to high; and in the case that the high digits in the change flag data are less than or equal to the preset value, output the original current input data as intermediate data, and set the flip flag data to low.

In one embodiment, the data determination module comprises:

a data comparison unit configured to set the change flag data to low when there is no change between the current input data and the previous input data; and set the change flag data to high when there is a change between the current input data and the previous input data;

a data determination unit, where the input end of the data determination unit is coupled to the output end of the data comparison unit to receive the change flag data, and the output end of the data determination unit is coupled to the flip flag signal line, where the data determination unit is used to set the flip flag data to high when the number of high data bits in the change flag data is greater than the preset value, and set the flip flag data to low when the number of high data bits in the change flag data is less than or equal to the preset value; and a data selector, where the input end of the data selector receives the flip flag data through the flip flag signal line, and the data selector is configured to output the flipped data of the current input data as intermediate data when the flip flag data is high, and output the original current input data as intermediate data when the flip flag data is low.

In one embodiment, the data comparison unit comprises:

a latch, configured to latch the state of the previous input data and the previous clock signal corresponding to the previous input data;

a state comparator coupled to the latch and used to set the change flag data to low when the state of the current input data does not change relative to the previous input data, and set the change flag data to high when the state of the current input data is changed relative to the previous input data.

In one embodiment, the change flag data and the intermediate data are each divided into a number of M sets, the flip flag data has M bits, the M-bit flip flag data is in one-to-one correspondence with the M sets of change flag data, and the M-bit flip flag data is in one-to-one correspondence with the M sets of intermediate data, where M is an integer greater than 1.

In one embodiment, each set of change flag data has N bits, where N is an integer greater than 1. The data determination module is used to: output the flipped data of the input set of change flag data as the corresponding set of intermediate data when the number of high data bits in the input set of change flag data is greater than N/2, and set the respective bit of the flip flag data corresponding to the input set of change flag data to high; and output the input set of change flag data as the corresponding set of intermediate data when number of high data bits in the input set of change flag data is less than or equal to N/2, and set the respective bit of the flip flag data corresponding to the input set of change flag data to low.

In an embodiment, the data selector comprises a plurality of M data selection units, each of which comprises:

a second inverter, where the input end of the second inverter receives the flip flag data through the flip flag signal line;

a third inverter, where the input end of the third inverter is coupled to the data determination unit, and is used to receive the current input data from the data determination unit;

a first transmission gate, where the input end of the first transmission gate is coupled to the output end of the third inverter, and the output end of the first transmission gate is coupled to data buffer module for outputting the intermediate data to the data buffer module, where the inverted control end of the first transmission gate is coupled to the output end of the second inverter, and the positive control end of the first transmission gate receives the flip flag data through the flip flag signal line;

a second transmission gate, where the input end of the second transmission gate is coupled to the data determination unit for receiving the current input data from the data determination unit, and the output end of the second transmission gate is coupled to the data buffer module for outputting the intermediate data to the data buffer module, the inverted control end of the second transmission gate receives the flip flag data through the flip flag signal line, and the positive control end of the second transmission gate is coupled to the output end of the second inverter.

In one embodiment, the global bus data includes M sets of global bus data, and the M-bit flip flag data corresponds to the M sets of global bus data in one-to-one correspondence. The data receiving module includes a number of M data receiving units coupled to the memory banks, where the data receiving unit is used to decode the global bus data of the corresponding set according to the one-bit flip flag data.

In one embodiment, the data receiving unit comprises:

a fourth inverter, where the input end of the fourth inverter receives the flip flag data through the flip flag signal line;

a fifth inverter, where the input end of the fifth inverter receives the global bus data through the global bus;

a third transmission gate, where the input end of the third transmission gate is coupled to the output end of the fifth inverter, and the output end of the third transmission gate is coupled to the memory bank, the third transmission gate being configured for outputting the decoded data to the memory bank, where the inverted control end of the third transmission gate is coupled to the output end of the fourth inverter, and the positive control end of the third transmission gate receives the flip flag data through the flip flag signal line;

a fourth transmission gate, where the input end of the fourth transmission gate receives the global bus data through the global bus, the output end of the fourth transmission gate is coupled to the memory bank, the fourth transmission gate being used to output the decoded data to the memory bank, where the inverted control end of the fourth transmission gate receives the flip flag data through the flip flag signal line, and the positive control end of the fourth transmission gate is coupled to the output end of the fourth inverter.

In one embodiment, the data buffer module comprises:

a plurality of logic NAND gates, where the two input ends of each of the plurality of logic NAND gates respectively receive the enable signal and the current input data;

a plurality of fifth inverters, where the input end of each of the plurality of fifth inverters receives the enable signal;

a plurality of logic NOR gates, where the two input ends of each of the plurality of logic NOR gates respectively receive current input data and be coupled to the fifth inverter;

a plurality of PMOS transistors, where the gate of each of the plurality of PMOS transistors is coupled to the output end of the logic NAND gate, and the drain of the PMOS transistor is coupled to the global bus;

a plurality of NMOS transistors, where the gate of each of the plurality of NMOS transistors is coupled to the output end of the logic NOR gate, and the drain of the NMOS transistor is coupled to the global bus and to the drain of the NMOS transistor.

In a second aspect, an embodiment of the present application provides a semiconductor memory including any one of the above-described write operation circuit.

In a third aspect, an embodiment of the present application provides a write operation method applied to a semiconductor memory, the write operation method comprising:

determining whether to flip a current input data depending on a number of changed data bits between a previous input data and the current input data of the semiconductor memory, so as to generate a flip flag data and intermediate data;

determining an initial state of a global bus based on an enable signal and the intermediate data; and decoding the global bus data on the global bus according to the flip flag data, where the decoding includes determining whether to flip the global bus data; and writing the decoded data into the memory bank.

In one embodiment, the operation of determining whether to flip a current input data depending on a number of changed data bits between a previous input data and the current input data of the semiconductor memory, so as to generate a flip flag data and intermediate data comprises:

determining a change flag data according to the change between the current input data and the previous input data;

when the number of high bits in the change flag data is greater than a preset value, outputting a flipped data of the current input data as the intermediate data, and setting the flip flag data to high; and in the case that the high digits in the change flag data are less than or equal to the preset value, outputting the original current input data as intermediate data, and setting the flip flag data to low.

In one embodiment, the operation of when the number of high bits in the change flag data is greater than a preset value, outputting a flipped data of the current input data as the intermediate data, and setting the flip flag data to high; and in the case that the high digits in the change flag data are less than or equal to the preset value, outputting the original current input data as intermediate data, and setting the flip flag data to low comprises:

dividing the change flag data into a number of M sets, where each set of change flag data has N bits, where both M and N are integers greater than 1;

when the number of high data bits in each set of the change flag data is greater than N/2, outputting a flipped data of the set of change flag data as the corresponding set of intermediate data, and setting a data bit in the flip flag data corresponding to the set of change flag data to high; and when the number of high data bits in each input set of the change flag data is greater than N/2, outputting a flipped data of the set of change flag data as the corresponding set of intermediate data, and setting a data bit in the flip flag data corresponding to the set of change flag data to low.

By adopting the foregoing technical solutions, embodiments of the present application can reduce the number of flips of the internal global bus under the TriState architecture, thereby greatly compressing the current and reducing the power consumption.

The above overview is intended for mere illustrative purposes and is not intended to be limiting in any means. In addition to the illustrative aspects, embodiments, and features described above, further aspects, embodiments, and features of the present application will be easily understood by referring to the accompanying drawings and the following detailed description.

BRIEF DESCRIPTION OF THE DRAWINGS

In the drawings, unless otherwise specified, the same reference numerals refer to the same or similar parts or elements throughout the multiple drawings. These drawings are not necessarily drawn to scale. It should be understood that these drawings only depict some embodiments according to the present application, and should not be regarded as limiting the scope of the present application.

DESCRIPTION OF REFERENCE SIGNS

Figure 1:
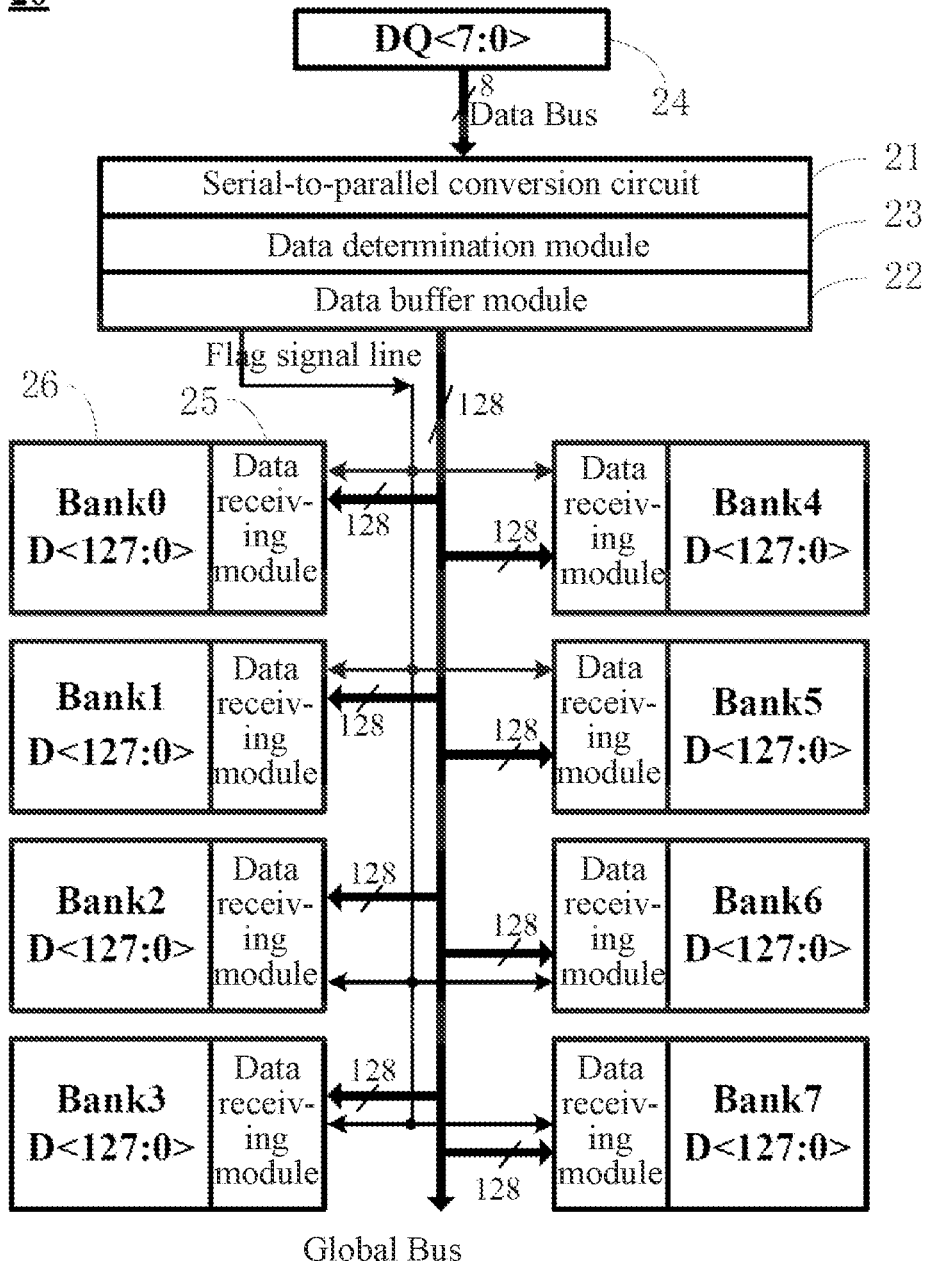
FIG. 1 schematically shows a block diagram of a part of the structure of a semiconductor memory according to an embodiment of the present application.

20: Semiconductor memory;
21: Serial-to-parallel conversion circuit;
22: Data buffer module;
23: Data determination module;
24: Data Queue (DQ) port;
25: Data receiving module;
26: Memory bank;
221: PMOS transistor;
222: NMOS transistor;
223: Logic NAND gate;
224: Logic NOR gate;
225: Fifth inverter;
231: Data determination unit;
232: Data selector;
233: Data comparison unit;
233A: Latch;
233B: Status comparator;
232': Data selection unit;
232A: Second inverter;
232B: Third inverter;
232C: First transmission gate;
232D: Second transmission gate;
250: Data receiving unit;
251: Fourth inverter;
252: Fifth inverter;
253: Third transmission gate;
254: Fourth transmission gate.

DETAILED DESCRIPTION OF EMBODIMENTS

Illustrative embodiments will now be described more fully below in connection with the accompanying drawings. However, these illustrative embodiments may be able to be practiced in a variety of forms, and therefore should not be construed as being limited to the embodiments set forth herein. On the contrary, these embodiments are provided so that this application will become comprehensive and complete, and will be able to fully convey the concept of these illustrative embodiments to those having ordinary skill in the art. In these drawings, same reference numerals denote the same or similar parts, and thus they will not be repeatedly detailed.

FIG. 1 schematically shows a block diagram of a part of the structure of a semiconductor memory according to an embodiment of the present application. As shown in FIG. 1, the semiconductor memory 20 includes a DQ port 24, a memory bank (bank) 26, and a write operation circuit. The write operation circuit includes a global bus (Global Bus), a flip flag (Flag) signal line, a serial-to-parallel conversion circuit 21, a data determination module 23, a data buffer module (Data Bus Buffer) 22, and a data receiving module 25. In one embodiment, the semiconductor memory 20 is a DRAM, such as a fourth-generation double-rate synchronous dynamic random access memory (Double Data Rate SDRAM 4, DDR4 for short).

In an example, as shown in FIG. 1, a 8-bit first input data DQ<7:0> may be input from the DQ port 24, so that the data to be written (namely the decoded data) D<127:0 would be written into the memory bank 26 through the write operation circuit. One Active command turns on the only one designated memory bank 26, and the write operation can only be performed on one memory bank 26. In other words, when one of the memory banks 26 (i.e. Bank<7:0>) is operating, the other Banks are not working. It should be noted, however, that the number of memory banks 26, the number of data bits of each memory bank 26, and the number and the number of data bits of the DQ ports 24 will not be limited in this embodiment. For example, there may be one DQ port 24, which is used to input a 8-bit first input data; there may also be two DQ ports 24, that is, each DQ port 24 is used to input a 8-bit first input data DQ<7:0> or DQ<15:8>, thus inputting in effect a 16-bit first input data DQ<15:0>.

Figure 2:
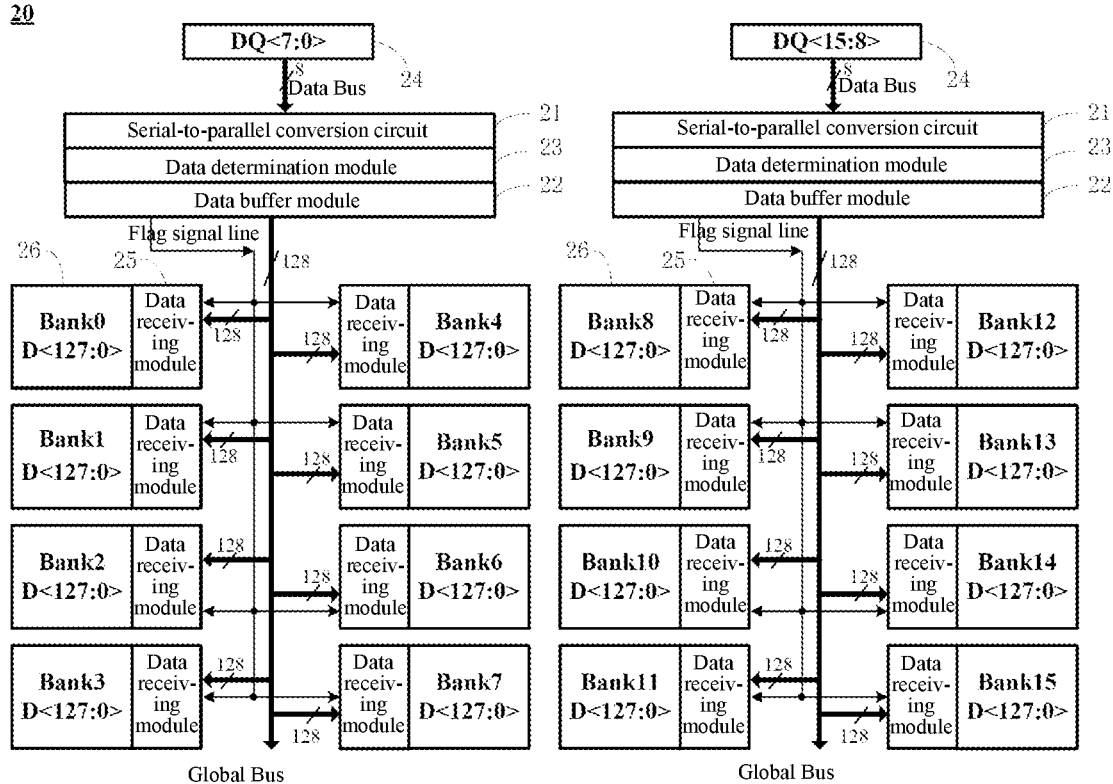
FIG. 2 schematically shows a block diagram of a part of the structure of a semiconductor memory according to another embodiment of the present application.

For example, as shown in FIG. 2, the first input data DQ<7:0> may perform a write operation on a set of memory banks Bank<7:0> through the above-mentioned write operation circuit; the first input data DQ<15:8> may perform a write operation on another set of memory banks Bank<15:8> through the above-mentioned another write operation circuit. Accordingly, among the eight memory banks 26 corresponding to DQ<15:8> (i.e. Bank<15:8>), when only one bank works, the other banks do not work.

In one embodiment, the write operation circuit includes a serial-to-parallel conversion circuit 21. The serial-to-parallel conversion circuit 21 is coupled between the DQ port 24 and the data determination module 23, and is used to perform serial-to-parallel conversion on the first input data of the DQ port 24 so as to generate a second input data. For example, the serial-to-parallel conversion circuit 21 may perform serial-to-parallel conversion on the 8-bit first input data DQ<7:0>, thus generating a 128-bit second input data D2'<127:0> corresponding to Bank0.

The semiconductor memory 20 may have an array structure, and different units may have the same structure. However, because the input data may be different, the output data of different units may be different. The following takes one memory bank as an example to introduce the write operation circuit of this embodiment.

As shown in FIGS. 1 and 2, the write operation circuit of this embodiment includes a data determination module 23, which is used to determine whether to flip the current input data depending on the number of changed bits of a current input data relative to a previous input data of the semiconductor memory so as to generate a flip flag data and an intermediate data.

In an example, the current input data may be the current second input data, such as D2'<127:0>.

Herein, the write operation is performed with a clock signal. In particular, the previous write operation corresponds to the previous clock signal, thus inputting the previous input data, while the current write operation corresponds to the current clock signal, thus inputting the current input data. As such, the data determination module 23 is also used to determine whether to flip the current input data according to the number of changed data bits between the previous input data and the current input data so as to output intermediate data and the Flag data for transfer by the Flag signal line.

In one embodiment, the data determination module 23 is used to: determine a change flag data according to the change between the current input data and the previous input data; when the number of high bits in the change flag data is greater than a preset value, output a flipped data of the current input data as the intermediate data, and set the flip flag data (Flag data) to high; and in the case that the high digits in the change flag data are less than or equal to the preset value, output the original current input data as intermediate data, and set the flip flag data (Flag data) to low.

For example, the change flag data may have 8 bits. If the number of bits equal to "1" in the change flag data exceeds half, that is, more than 4 bits (for example, 5 bits), then Flag=1, and the first intermediate data as output is equal to the flipped data of the change flag data. Otherwise if the number of bits equal to "1" in the written data is less than half, e.g., if the data bits equal to "1" have 3 bits, then Flag=0, and the output first intermediate data will be equal to the original change flag data.

As meant herein, a "high" data bit may mean a data bit that is equal to "1", while a "low" data bit may be a data bit that is equal to "0". Data flipping can be understood as changing from "0" to "1", or from "1" to "0". The flipping of the data line or the signal line may be understood as changing a high level to a low level, or changing a low level to a high level.

Figure 3:
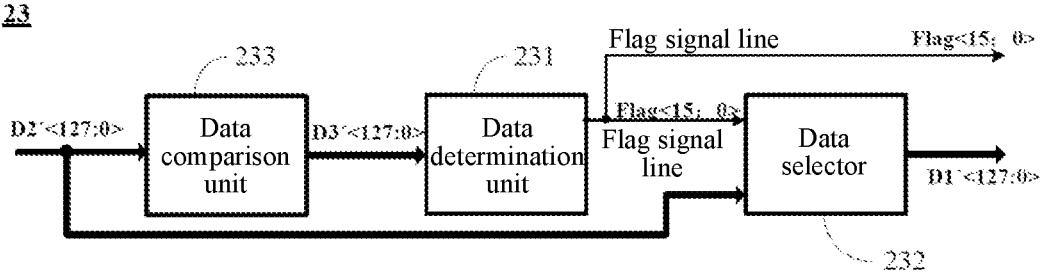
FIG. 3 schematically shows a block diagram of a data determination module according to an embodiment of the present application.

In one embodiment, as illustrated in FIG. 3, the data determination module 23 may include a data comparison unit 233, a data determination unit 231 and a data selector 232.

The input end of the data comparison unit 233 receives an input data. For example, the input end of the data comparison unit 233 may be coupled to the output end of the serial-to-parallel conversion circuit 21 for receiving the second input data. The data comparison unit 233 is used to set the change flag data to low when there is no change between the current input data and the previous input data; and set the change flag data (such as D3'<127:0>) to high when there is a change between the current input data and the previous input data.

Figure 4:
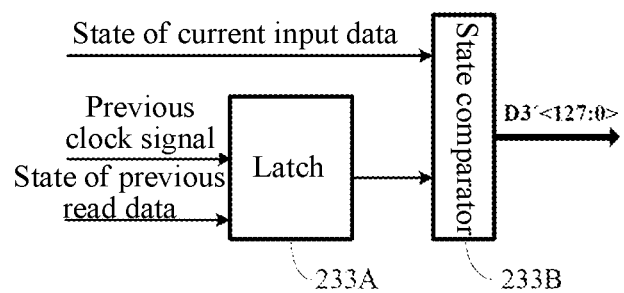
FIG. 4 schematically shows a block diagram of a data comparison unit according to an embodiment of the present application.

In one embodiment, as illustrated in FIG. 4, the data comparison unit 233 includes a latch 233A and a status comparator 233B. The latch 233A is used to latch the state of the previous input data and the previous clock signal (Pre-Clock) corresponding to the previous input data. The status comparator 233B is coupled to the latch 233A, and is used to set the change flag data to low when the state of the current input data is not changed relative to the previous input data, and set the change flag data to high when the state of the current input data is changed relative to the previous input data.

The input end of the data determination unit 231 is coupled to the output end of the data comparison unit 233 to receive the change flag data. The output end of the data determination unit 231 is coupled to the Flag signal line. The data determination unit 231 is configured to set the Flag data to high when the number of high data bits in the change flag data is greater than the preset value, and set the Flag data to low when the number of high data bits in the change flag data is less than or equal to the preset value.

The input end of the data selector 232 receives Flag data through the Flag signal line and also receives current input data. The output end of the data selector 232 is coupled to the middle. The data selector 232 is used to output the flipped data of the current input data as the intermediate data when the Flag data is high, and use the original current input data as the intermediate data when the Flag data is high.

In an example, the multi-bit change flag data is not seted, that is, the Flag data may be one bit. In an example, the multi-bit change flag data may be seted. For example, in one embodiment, the change flag data and the intermediate data may each be divided into a number of M sets, where the Flag data has M bits, the M-bit Flag data has an one-to-one correspondence with the M sets of change flag data, and the M-bit flag data has an one-to-one correspondence with the M sets of intermediate data, where M is an integer greater than 1.

Further, each set of change flag data may have N bits, where N is an integer greater than 1. The data determination module 23 is used to: output the flipped data of the input set of change flag data as the corresponding set of intermediate data when the number of high data bits in the input set of change flag data is greater than N/2, and set the respective bit of the Flag data corresponding to the input set of change flag data to high; and output the input set of change flag data as the corresponding set of intermediate data when number of high data bits in the input set of change flag data is less than or equal to N/2, and set the respective bit of the Flag data corresponding to the input set of change flag data to low.

For example, the change flag data D3'<127:0> is divided into 16 sets, so that each set of change flag data has 8 bits, and each set of change flag data corresponds to one bit of the Flag data. Correspondingly, the Flag data has 16 bits, such as Flag<15:0>. The intermediate data D1'<127:0> will be divided into 16 sets accordingly. Each bit of the Flag data corresponds to a set of intermediate data. For a set of change flag data D3'<127:120>, if the number of digits equal to "1" in D3'<127:120> is greater than 4 bits, then the corresponding Flag<15>=1, the set of intermediate data D1'<120:127> that is output is equal to the flipped data of D3'<127:120>. If the number of bits equal to "1" in the change flag data is less than or equal to 4 bits, then the corresponding Flag<15>=0, and the set of intermediate data D1'<120:127> that is output is just D3'<127:120>. Similarly, for a set of change flag data D3'<15:8>, if the number of bits equal to "1" in D3'<15:8> is greater than 4, then the corresponding Flag<1>=1, the set of intermediate data D1'<15:8> that is output is equal to the flipped data of D3'<15:8>. Otherwise if the number of bits equal to "1" in the change flag data is less than or equal to 4 bits, then the corresponding Flag<1>=0, and the output set of intermediate data D1'<15:8> is just D3'<15:8>. For a set of change flag data D3'<7:0>, if the number of bits equal to "1" in D3'<7:0> is greater than 4, then the corresponding Flag<0>=1, the output set of intermediate data D1'<7:0> is equal to the flipped data of D3'<7:0>. Otherwise if the number of bits equal to "1" in the change flag data is less than or equal to 4 bits, then the corresponding Flag<0>=0, and the output set of intermediate data D1'<7:0> will just be D3'<7:0>.

Further, as illustrated in FIGS. 1 and 2, the write operation circuit further includes a data buffer module 22. The data buffer module 22 receives an enable (Enable) signal and is coupled to the data determination module 23 to receive the intermediate data. The data buffer module 22 is used to determine the initial state of the global bus according to the Enable signal and the intermediate data. That is to say, in this embodiment, the semiconductor memory 20 adopts a TriState global bus transfer structure.

Figure 5:
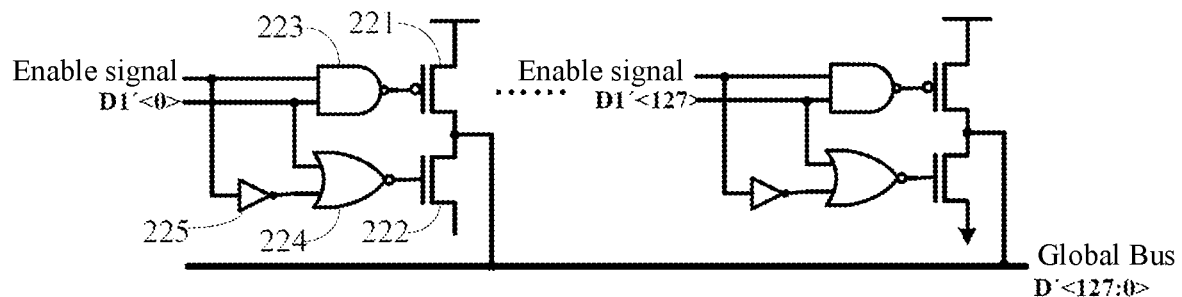
FIG. 5 schematically shows a circuit diagram of a data buffer module according to an embodiment of the present application.

FIG. 5 schematically shows a circuit diagram (corresponding to one memory bank 26) of a data buffer module 22 according to an embodiment of the present application. As illustrated in FIG. 5, the data buffer module 22 includes a plurality of PMOS (Positive Channel Metal Oxide Semiconductor) transistors 221, a plurality of NMOS (Negative Channel Metal Oxide Semiconductor) transistors 222, a plurality of logic NAND gates 223, and a plurality of fifth inverters 225, and a plurality of logic NOR gates 224.

The two input ends of the logic NAND gate 223 receive the enable signal and the intermediate data respectively. The input end of the fifth inverter 225 receives the enable signal. One of the two input ends of the NOR gate 224 receives the intermediate data and the other is coupled to the fifth inverter 225. The gate of the PMOS transistor 221 is coupled to the output end of the logic NAND gate 223, and the drain is coupled to the global bus. The gate of the NMOS transistor 222 is coupled to the output end of the NOR gate 224, and the drain is coupled to the global bus.

It should be noted that the PMOS transistor 221, the NMOS (Negative Channel Metal Oxide Semiconductor) transistor 222, the logic NAND gate 223, the fifth inverter 225, and the logic NOR gate 224 are provided in multiple sets, and each set corresponds to one bit of the intermediate data.

In the related technology, under the TriState architecture, the global bus will flip along with the transition of input data during a write operation. If the input data is "1", the information "1" is transferred through the internal global bus. If the input data is "0", then "0" is transferred through the internal global bus. In this way, if the previous input data bits are all "1" and the intermediate data bits are all "0", then each global bus will be flipped. In the semiconductor memory 20 illustrated in FIG. 2, which is a 256-bit wide global bus, then there will be 256-bit global bus flipping, such that the current transmitted on the line is very large. Therefore, in the related art, under the TriState architecture, when there are too many changed data bits between the data transferred earlier on the global bus and the data transferred later on the global bus during the write operation, there will be an excessive number of global buses that need to be flipped, thus resulting in an increased current.

Contrasting thereto, in the embodiment of the present application, through the data determination module 23, during the write operation, if the number of changed data bits between the current input data and the previous input data is too large, a Flag data will be generated to invert (flip) all current data bits, so that the number of flips of the global buses will be greatly reduced or even eliminated, thereby saving current.

In one embodiment, the data selector 232 includes a number of M data selection units 232', where each data selection unit 232' is used to process one bit of Flag data and a set of current input data. For example, there may be 16 data selection units 232', corresponding to respective 16 sets of current input data and one bit of the Flag data.

Figure 6:
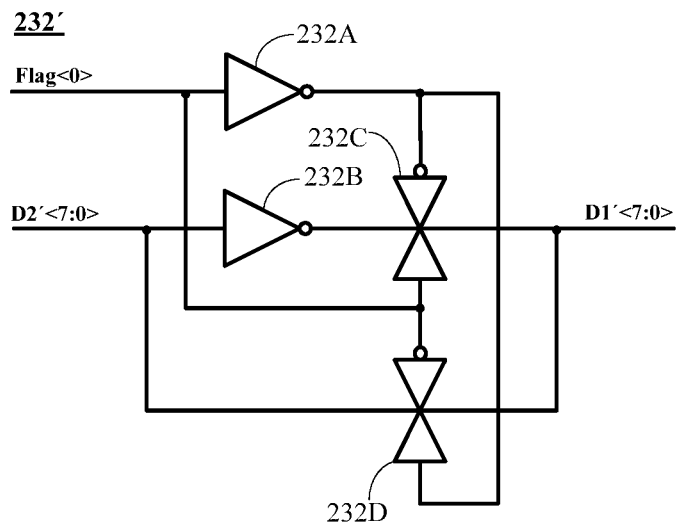
FIG. 6 schematically shows a block diagram of a data selection unit according to an embodiment of the present application.

FIG. 6 shows an implementation of the data selection unit 232'. As shown in FIG. 6, the data selection unit 232' includes a second inverter 232A, a third inverter 232B, a first transmission gate 232C, and a second transmission gate 232D.

The input end of the second inverter 232A receives Flag data through the Flag signal line. The input end of the third inverter 232B receives the current input data. The input end of the first transmission gate 232C is coupled to the output end of the third inverter 232B. The output end of the first transmission gate 232C is coupled to the data buffer module 22 for outputting the intermediate data to the data buffer module 22. The inverted control end of the first transmission gate 232C (the upper control end in FIG. 6) is coupled to the output end of the second inverter 232A. The positive control end of the first transmission gate 232C (the lower control end in FIG. 6) receives Flag data through the Flag signal line. The input end of the second transmission gate 232D receives the current input data. The output end of the second transmission gate 232D is coupled to the data buffer module 22 for outputting the intermediate data to the data buffer module 22. The inverted control end of the second transmission gate 232D receives the Flag data through the Flag signal line. The positive control end of the second transmission gate 232D is coupled to the output end of the second inverter 232A.

Take Flag<0> and the current input data D2'<7:0> as an example, as illustrated in FIG. 6, when Flag=1, the intermediate data D1'<7:0> is the flipped data of the current input data D2'<7:0>. Otherwise when Flag=0, the intermediate data D1'<7:0> is the current input data D2'<7:0>.

It should be noted that one set of the third inverter 232B, first transmission gate 232C, and second transmission gate 232D is used to process one bit of the current input data and output one bit of the corresponding intermediate data. In other words, corresponding to the 8-bit current input data D2'<7:0>, there should also be 8 sets of the third inverter 232B, the first transmission gate 232C, and the second transmission gate 232D, thus outputting the 8-bit intermediate data D1'<7:0>.

Figure 7:
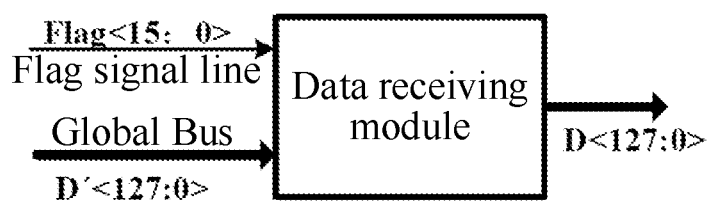
FIG. 7 schematically shows a block diagram of a data receiving module according to an embodiment of the present application.

As shown in FIGS. 1, 2 and 7, the write operation circuit in this embodiment further includes a data receiving module 25. The input end of the data receiving module 25 is coupled to the global bus and to the flip flag signal line. The output end of the data receiving module 25 is coupled to the memory bank 26. The data receiving module 25 is used to determine whether to flip the global bus data (decoding the global bus data) according to the Flag data, and write the decoded data (data to be written) into the memory bank 26. For example, when the Flag data is high, the flipped data of the global bus data may be output as the data to be written; and when the Flag data is low, the original global bus data may be output as the data to be written.

As a result, the written data is restored to the input data of the semiconductor memory. Accordingly, the data and functions of the external ports of the semiconductor memory 20, such as the DQ port 24 and the DBI port (not shown in the figures), will not be changed.

Figure 8:
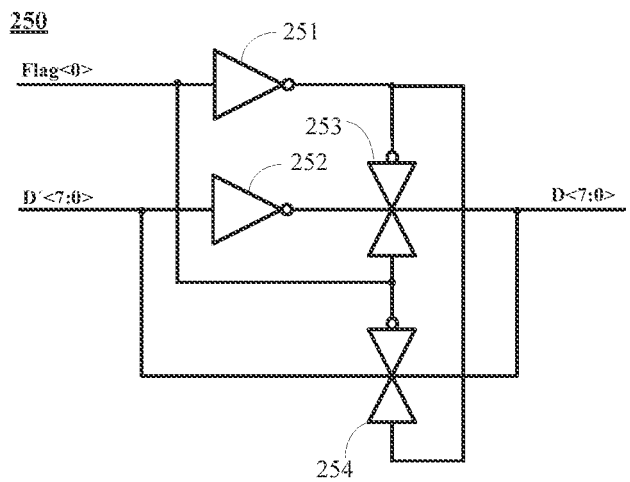
FIG. 8 schematically shows a block diagram of a data receiving unit according to an embodiment of the present application.

In one embodiment, the data receiving module 25 may include a plurality of data receiving units 250, where each data receiving unit 250 is used to process one bit of Flag data and a set of global bus data. For example, there may be 16 data receiving units 250, corresponding to respective 16 sets of global bus data and one bit of Flag data. FIG. 8 shows an implementation of the data receiving unit 250.

As illustrated in FIG. 8, the data receiving unit 250 includes a fourth inverter 251, a fifth inverter 252, a third transmission gate 253, and a fourth transmission gate 254.

The input end of the fourth inverter 251 receives the Flag data through the Flag signal line. The input end of the fifth inverter 252 receives the global bus data through the global bus. The input end of the third transmission gate 253 is coupled to the output end of the fifth inverter 252. The output end of the third transmission gate 253 is coupled to the memory bank 26 for outputting data to be written into the memory bank 26. The inverted control end of the third transmission gate 253 (the upper control terminal shown in FIG. 8) is coupled to the output end of the fourth inverter 251. The positive control end of the third transmission gate 253 receives the Flag data through the Flag signal line. The input end of the fourth transmission gate 254 receives the global bus data through the global bus. The output end of the fourth transmission gate 254 is coupled to the memory bank 26 for outputting data to be written into the memory bank 26. The inverted control end (the upper control end shown in FIG. 8) of the fourth transmission gate 254 receives Flag data through the Flag signal line, and the positive control end (the lower control end shown in FIG. 8) of the fourth transmission gate 254 is coupled to the output end of the fourth inverter 251.

Take Flag<0> and global bus data D'<7:0> as an example, as shown in FIG. 8, when Flag=1, written data D<7:0> is the flipped data of the global bus data D'<7:0>. Otherwise when Flag=0, the written data D<7:0> is just the global bus data D'<7:0>, that is, D<7:0>=D'<7:0>.

It should be noted that one set of the fifth inverter 252, third transmission gate 253, and fourth transmission gate 254 are used to process one bit of global bus data and output one bit of corresponding written data. In other words, corresponding to 8-bit global bus data D'<7:0>, there should also be eight sets of the fifth inverter 252, the third transmission gate 253, and the fourth transmission gate 254, thus then outputting the 8-bit written data D<7:0>.

According to the semiconductor memory 20 of this embodiment, in the process of writing data to the semiconductor memory 20 (for example, the first input data bits are all 1, while the second input data bits are all 0), the global bus data has 256 bits in total, then if it is needed to flip the 256-bit global bus, the outcome would be that only 32-bit Flag data will be flipped, so that the write current will be greatly compressed.

The semiconductor memory 20 of this embodiment may further include other structures such as a sense amplifier in practical applications, which are all existing technologies and so are not repeatedly detailed in this embodiment for brevity.

Figure 9:
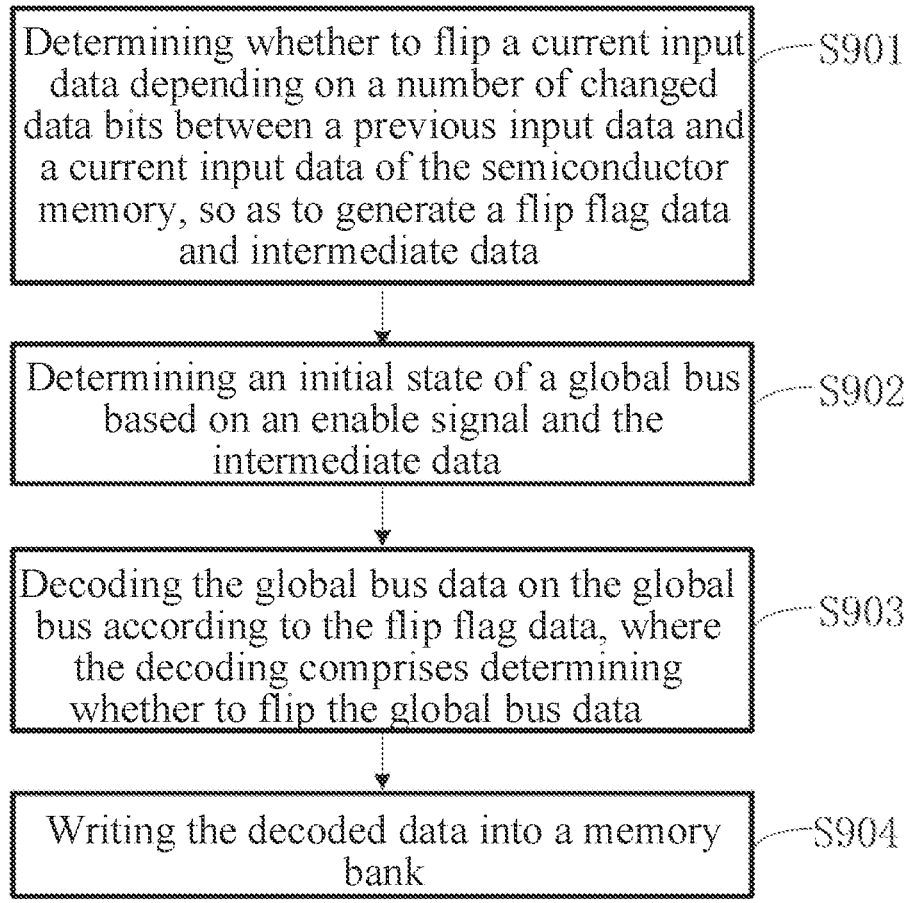
FIG. 9 schematically shows a flowchart of a write operation method according to an embodiment of the present application.

FIG. 9 schematically shows a flowchart of a write operation method according to an embodiment of the present application. This writing operation method can be applied to the semiconductor memory 20 described above. As shown in FIG. 9, the write operation method may include the following operations:

S901: determining whether to flip a current input data depending on a number of changed data bits between a previous input data and the current input data of the semiconductor memory, so as to generate a flip flag data and intermediate data;

S902: determining an initial state of a global bus based on an enable signal and the intermediate data; and S903: decoding the global bus data on the global bus according to the flip flag data, where the decoding includes determining whether to flip the global bus data; and S904: writing the decoded data into the memory bank.

In one embodiment, the operation S901 may include: determining a change flag data according to the change between the current input data and the previous input data; when the number of high bits in the change flag data is greater than a preset value, outputting a flipped data of the current input data as the intermediate data, and setting the flip flag data to high; and in the case that the high digits in the change flag data are less than or equal to the preset value, outputting the original current input data as intermediate data, and setting the flip flag data to low.

In one embodiment, the operation S901 may further include: dividing the change flag data into a number of M sets, where each set of change flag data has N bits, and both M and N are integers greater than 1; outputting the flipped data of the input set of change flag data as the corresponding set of intermediate data when the number of high data bits in the input set of change flag data is greater than N/2, and setting the respective bit of the flip flag data corresponding to the input set of change flag data to high; and outputting the input set of change flag data as the corresponding set of intermediate data when number of high data bits in the input set of change flag data is less than or equal to N/2, and setting the respective bit of the flip flag data corresponding to the input set of change flag data to low.

The write operation circuit provided by this embodiment of the present application can be applied to a semiconductor memory with a global bus transfer structure of the TriState type, which can reduce the number of internal global bus flips before data is written into the memory block, thus greatly compressing the current and reducing the power consumption.

As used herein, references to the terms "one embodiment", "some embodiments", "examples", "specific examples", or "some examples" etc. are intended to mean that specific features, structures, materials, or characteristics described in connection with this embodiment or example are included in at least one embodiment or example of the present application. Furthermore, the described specific features, structures, materials or characteristics can be combined in any one or more embodiments or examples in a suitable manner. In addition, those having ordinary skill in the art may be able to combine the different embodiments or examples and the features of the different embodiments or examples described in this specification, in the premise that no contradiction or conflict is present.

Furthermore, the described features, structures or characteristics may be combined in one or more embodiments in any suitable manner. However, those having ordinary skill in the art will be able to realize that the technical solutions of the present application can be practiced without the presence of one or more of the specific details, or other methods, components, materials, devices, steps, etc. can be used. In other cases, well-known structures, methods, devices, implementations, materials, or operations are not shown or described in detail to avoid obscuring various aspects of the present application.

As used herein, terms "first", "second", or the like are merely used for illustrative purposes, and shall not be construed as indicating relative importance or implicitly indicating the number of technical features specified. Thus, the features defined by "first" and "second" may explicitly or implicitly include one or more of such features. As used herein, terms "multiple" or "a plurality of" means two or more, unless otherwise specifically defined.

It should be noted that although the various steps of the method in this application are described in a specific order shown in the drawings, this does not require or imply that these steps must be performed in the specific order, or that all the steps shown must be performed to achieve the desired result. Additionally or alternatively, some steps may be omitted, multiple steps may be combined into one step for execution, and/or one step may be decomposed into multiple steps for execution, etc. The above-mentioned drawings are merely schematic illustrations of the processing included in the method according to the exemplary embodiments of the present application, and are not intended for limitation. It is readily understood that the processings shown in the above drawings does not indicate or limit the time order of these processings. In addition, it is readily understood that these processes can be executed synchronously or asynchronously in multiple modules, for example.

Furthermore, although the spirit and principle of this application have been described with reference to several specific embodiments, it should be understood that this application will not be limited to the disclosed specific embodiments, and the division of various aspects does not mean that the features in these aspects cannot be combined for benefit; in fact, this division is merely intended for the convenience of presentation. This application is intended to cover various modifications and equivalent arrangements included within the spirit and scope of the appended claims.

The foregoing merely depicts some specific implementations of this application, but the scope of protection of this application will not be limited thereto. Any person familiar with the technical field will be able to easily think of various changes or substitutions within the technical scope disclosed in this application, and these should all be covered by the scope of protection of this application. Therefore, the scope of protection of this application should be subject to the scope of protection of the appended claims.

What is claimed is:

1. A write operation circuit applied to a semiconductor memory, the write operation circuit comprising:
   a data determination module, configured to determine whether to flip a current input data of the semiconductor memory depending on a number of changed data bits between a previous input data and the current input data of the semiconductor memory to generate a flip flag data and an intermediate data;
   a data buffer module, coupled to the data determination module and configured to determine an initial state of a global bus based on an enable signal and the intermediate data; and
   a data receiving module coupled to a memory bank, wherein the data receiving module is configured to receive a global bus data on the global bus, receive the flip flag data through a flip flag signal line, decode the global bus data according to the flip flag data, and write a decoded data into the memory bank of the semiconductor memory, wherein the decoding comprises determining whether to flip the global bus data.

2. The write operation circuit of claim 1, wherein the data determination module is configured to:
   determine a change flag data according to the change between the current input data and the previous input data;
   when a number of high data bits in the change flag data is greater than a preset value, output a flipped data of the current input data as the intermediate data, and set the flip flag data to high; and
   when a number of high data bits in the change flag data is less than or equal to the preset value, output the original current input data as the intermediate data, and set the flip flag data to low.

3. The write operation circuit of claim 2, wherein the data determination module comprises:
   a data comparison unit, configured to set the change flag data to low when there is no change between the current input data and the previous input data; and set the change flag data to high when there is a change between the current input data and the previous input data;
   a data determination unit, comprising an input end coupled to an output end of the data comparison unit to receive the change flag data, and an output end coupled to the flip flag signal line, wherein the data determination unit is configured to set the flip flag data to high when the number of high data bits in the change flag data is greater than the preset value, and set the flip flag data to low when the number of high data bits in the change flag data is less than or equal to the preset value; and
   a data selector, comprising an input end operative to receive the flip flag data through the flip flag signal line, wherein the data selector is configured to output the flipped data of the current input data as the intermediate data when the flip flag data is high, and output the original current input data as the intermediate data when the flip flag data is low.

4. The write operation circuit of claim 3, wherein the data comparison unit comprises:
   a latch, configured to latch a state of the previous input data and a previous clock signal corresponding to the previous input data; and
   a state comparator, coupled to the latch and configured to set the change flag data to low when a state of the current input data does not change relative to the previous input data, and set the change flag data to high when the state of the current input data is changed relative to the previous input data.

5. The write operation circuit of claim 2, wherein the change flag data and the intermediate data are each divided into a number of M sets, the flip flag data has M bits, and the M-bits flip flag data is in one-to-one correspondence with the M sets of change flag data, and the M-bits flip flag data is in one-to-one correspondence with the M sets of intermediate data, where M is an integer greater than 1.

6. The write operation circuit of claim 5, wherein each set of change flag data has N bits, where N is an integer greater than 1, wherein the data determination module is configured for outputting the flipped data of an input set of change flag data as a corresponding set of intermediate data when the number of high data bits in the input set of change flag data is greater than N/2, and setting a data bit of the flip flag data corresponding to the input set of change flag data to high; and when the number of high data bits in the input set of change flag data is less than or equal to N/2, outputting the input set of change flag data as the corresponding set of intermediate data, and setting the data bit of the flip flag data corresponding to the input set of change flag data to low.

7. The write operation circuit of claim 3, wherein the data selector comprises a plurality of data selection units, each of which comprises:
    a second inverter, comprising an input end configured to receive the flip flag data through the flip flag signal line;
    a third inverter, comprising an input end coupled to the data determination unit for receiving the current input data from the data determination unit;
    a first transmission gate, comprising an input end coupled to an output end of the third inverter, an output end coupled to data buffer module for outputting the intermediate data to the data buffer module, an inverted control end coupled to an output end of the second inverter, and a positive control end that is operative to receive the flip flag data through the flip flag signal line;
    a second transmission gate, comprising an input end coupled to the data determination unit for receiving the current input data from the data determination unit, an output end coupled to the data buffer module for outputting the intermediate data to the data buffer module, an inverted control end operative to receive the flip flag data through the flip flag signal line, and a positive control end coupled to the output end of the second inverter.

8. The write operation circuit of claim 1, wherein the global bus data comprises M sets of global bus data, and M-bit flap flag data has an one-to-one correspondence with the M sets of global bus data, and wherein the data receiving module comprises a number of M data receiving units coupled to the respective memory banks, wherein each of the M data receiving units is configured to decode a respective set of global bus data according to a respective bit of the flip flag data.

9. The write operation circuit of claim 8, wherein each of the M data receiving units comprises:
    a fourth inverter, comprising an input end configured to receive the flip flag data through the flip flag signal line;
    a fifth inverter, comprising an input end configured to receive the global bus data through the global bus;
    a third transmission gate, comprising an input end coupled to an output end of the fifth inverter and an output end coupled to the memory bank, the third transmission gate being configured for outputting the decoded data to the memory bank, wherein the third transmission gate comprises an inverted control end coupled to the output end of the fourth inverter, and a positive control end operative to receive the flap flag data through a flap flag signal line; and
    a fourth transmission gate, comprising an input end configured to receive the global bus data through the global bus and an output end coupled to the memory bank, the fourth transmission gate being configured to output the decoded data to the memory bank, wherein the fourth transmission gate comprises an inverted control end operative to receive the flap flag data through the flap flag signal line, and a positive control end coupled to the output end of the fourth inverter.

10. The write operation circuit of claim 1, wherein the data buffer module comprises:
    a plurality of logic NAND gates, each of which comprising two input ends operative to receive the enable signal and the current input data, respectively;
    a plurality of fifth inverters, each of which comprising an input end operative to receive the enable signal;
    a plurality of logic NOR gates, comprising two input ends, wherein one of the two input ends is operative to receive the current input data, and another is coupled to the fifth inverter;
    a plurality of PMOS transistors, each of which comprising a gate coupled to the output end of the logic NAND gate, and a drain coupled to the global bus; and
    a plurality of NMOS transistors, each of which comprising a gate coupled to the output end of the logic NOR gate, and a drain coupled to the global bus and to the drain of the NMOS transistor.

11. A semiconductor memory, comprising a write operation circuit, wherein the write operation circuit comprising:
    a data determination module, configured to determine whether to flip a current input data of the semiconductor memory depending on a number of changed data bits between a previous input data and the current input data of the semiconductor memory to generate a flip flag data and an intermediate data;
    a data buffer module, coupled to the data determination module and configured to determine an initial state of a global bus based on an enable signal and the intermediate data; and
    a data receiving module coupled to a memory bank, wherein the data receiving module is configured to receive a global bus data on the global bus, receive the flip flag data through a flip flag signal line, decode the global bus data according to the flip flag data, and write a decoded data into the memory bank of the semiconductor memory, wherein the decoding comprises determining whether to flip the global bus data.

12. A write operation method applied to a semiconductor memory, the write operation method comprising:
    determining whether to flip a current input data depending on a number of changed data bits between a previous input data and a current input data of the semiconductor memory to generate a flip flag data and an intermediate data;
    determining an initial state of a global bus based on an enable signal and the intermediate data;
    decoding a global bus data on the global bus according to the flip flag data, wherein the decoding comprises determining whether to flip the global bus data; and
    writing a decoded data into a memory bank.

13. The write operation method of claim 12, wherein the determining whether to flip the current input data depending on the number of changed data bits between the previous input data and the current input data of the semiconductor memory to generate the flip flag data and the intermediate data comprises:
    determining a change flag data according to the change between the current input data and the previous input data; and
    when a number of high bits in the change flag data is greater than a preset value, outputting a flipped data of the current input data as the intermediate data, and setting the flip flag data to high; and when a number of high data bits in the change flag data is less than or equal to the preset value, outputting the original current input data as intermediate data, and setting the flip flag data to low.

14. The write operation method of claim 13, wherein the when the number of high data bits in the change flag data is greater than a preset value, outputting a flipped data of the current input data as the intermediate data, and setting the flip flag data to high; and when the number of high data bits in the change flag data is less than or equal to the preset value, outputting the original current input data as the intermediate data, and setting the flip flag data to low comprises:
- dividing the change flag data into a number of M sets, where each set of change flag data has N bits, where both M and N are integers greater than 1;
- when the number of high data bits in each set of the change flag data is greater than N/2, outputting a flipped data of the set of change flag data as a corresponding set of intermediate data, and setting a data bit in the flip flag data corresponding to the set of change flag data to high; and
- when the number of high data bits in each input set of the change flag data is greater than N/2, outputting a flipped data of the set of change flag data as the corresponding set of intermediate data, and setting a data bit in the flip flag data corresponding to the set of change flag data to low.

* * * * *